US012124721B2

(12) United States Patent
Palmer

(10) Patent No.: US 12,124,721 B2
(45) Date of Patent: Oct. 22, 2024

(54) POWER SAFETY CONFIGURATIONS FOR LOGICAL ADDRESS SPACE PARTITIONS

(71) Applicant: Micron Technology, Inc., Boise, ID (US)

(72) Inventor: David Aaron Palmer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 109 days.

(21) Appl. No.: 17/892,607

(22) Filed: Aug. 22, 2022

(65) Prior Publication Data

US 2024/0061602 A1    Feb. 22, 2024

(51) Int. Cl.
*G06F 3/06* (2006.01)

(52) U.S. Cl.
CPC .......... *G06F 3/0644* (2013.01); *G06F 3/0604* (2013.01); *G06F 3/0659* (2013.01); *G06F 3/0679* (2013.01)

(58) Field of Classification Search
CPC .... G06F 3/0644; G06F 3/0604; G06F 3/0659; G06F 3/0679
USPC ......................................................... 711/154
See application file for complete search history.

(56) References Cited

U.S. PATENT DOCUMENTS

| 10,528,264 | B2* | 1/2020 | Kim | G06F 12/0866 |
|---|---|---|---|---|
| 2004/0054698 | A1* | 3/2004 | Iwami | G06F 3/0605 |
| 2011/0202790 | A1* | 8/2011 | Rambo | G06F 3/0605 |
| | | | | 714/E11.088 |
| 2013/0188437 | A1* | 7/2013 | Jarmay | G06F 12/1433 |
| | | | | 365/228 |
| 2014/0281152 | A1* | 9/2014 | Karamcheti | G06F 3/061 |
| | | | | 711/103 |
| 2015/0161399 | A1* | 6/2015 | Mylly | G06F 21/79 |
| | | | | 726/30 |
| 2018/0307625 | A1* | 10/2018 | Lee | G06F 12/145 |
| 2023/0059382 | A1* | 2/2023 | Kim | G06F 12/1408 |
| 2023/0161715 | A1* | 5/2023 | Lee | G06F 12/1441 |
| | | | | 711/102 |
| 2023/0305722 | A1* | 9/2023 | Yang | G06F 3/0679 |
| 2023/0333750 | A1* | 10/2023 | Kim | G06F 3/0679 |

* cited by examiner

*Primary Examiner* — Christopher B Shin
(74) *Attorney, Agent, or Firm* — Lowenstein Sandler LLP

(57) ABSTRACT

A system includes a memory device associated with a logical address space, and a processing device, operatively coupled to the memory device, to perform operations including providing, to a host system, power safety capability information for the logical address space, obtaining, from the host system, a power safety configuration for a partition of the logical address space, and providing, to the host system, an acknowledgement of receipt of the power safety configuration.

20 Claims, 5 Drawing Sheets

| Partition Name 310 | Starting Address 320 | Address Length 330 | Purpose 340 | Power safety 350 |
|---|---|---|---|---|
| Boot | 0 | 16,384 | Stores boot loader | Enabled |
| System | 16,384 | 5,242,880 | Stores system and services files | Enabled |
| Cache | 5,259,264 | 1,048,576 | Temporary memory extension | Disabled |
| App | 6,307,840 | 16,777,216 | User application binaries | Disabled |
| Appdata | 23,085,056 | 16,777,216 | User application data | Enabled |
| Media | 39,862,272 | 22,637,728 | User media files | Disabled | ns
POWER SAFETY CONFIGURATIONS FOR LOGICAL ADDRESS SPACE PARTITIONS

TECHNICAL FIELD

Embodiments of the disclosure relate generally to memory sub-systems, and more specifically, relate to implementing power safety configurations for logical address space partitions.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
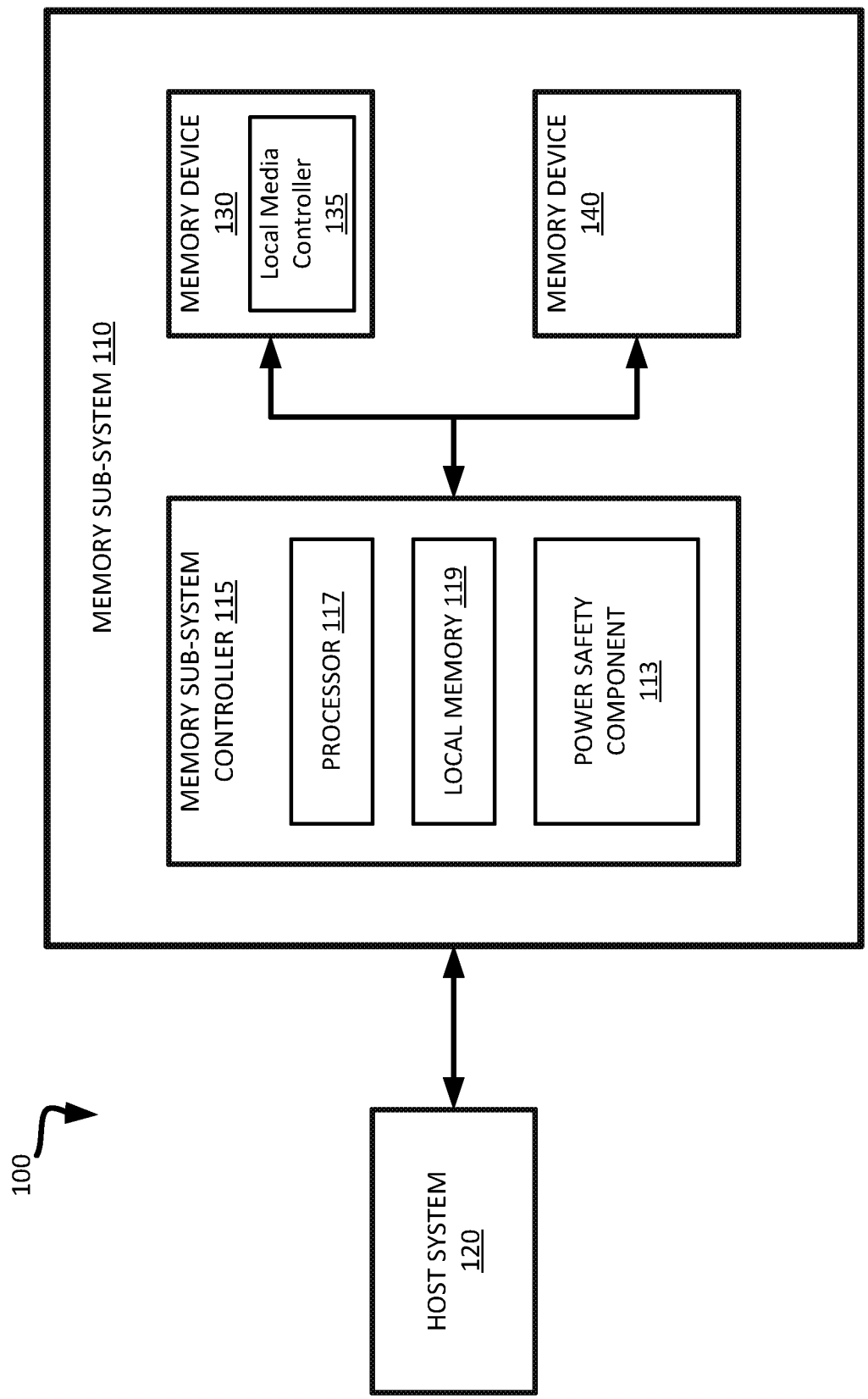
FIG. 1 illustrates an example computing system that includes a memory sub-system, in accordance with some embodiments of the present disclosure.

Aspects of the present disclosure are directed to implementing power safety configurations for logical address space partitions. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more memory planes ("planes"). For some types of non-volatile memory devices (e.g., NAND devices), each plane consists of a set of physical blocks ("blocks"). Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple memory cells arranged in a two-dimensional grid. The memory cells are formed onto a silicon wafer in an array of columns (also referred to as bitlines) and rows (also referred to as wordlines). A wordline can refer to one or more rows of memory cells of a memory device that are used with one or more bitlines to generate the address of each of the memory cells. The intersection of a bitline and wordline constitutes the address of the memory cell. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory cell can be programmed (written to) by applying a certain voltage to the memory cell, which results in an electric charge being held by the memory cell. For example, a voltage signal $V_{CG}$ that can be applied to a control electrode of the cell to open the cell to the flow of electric current across the cell, between a source electrode and a drain electrode. More specifically, for each individual memory cell (having a charge Q stored thereon) there can be a threshold control gate voltage $V_T$ (herein also referred to as the "threshold voltage" or simply as "threshold") such that the source-drain electric current is low for the control gate voltage ($V_{CG}$) being below the threshold voltage, $V_{CG}<V_T$. The current increases substantially once the control gate voltage has exceeded the threshold voltage, $V_{CG}>V_T$. Because the actual geometry of the electrodes and gates varies from cell to cell, the threshold voltages can be different even for cells implemented on the same die. The memory cells can, therefore, be characterized by a distribution P of the threshold voltages, $P(Q,V_T)=dW/dV_T$, where dW represents the probability that any given cell has its threshold voltage within the interval $[V_T, V_T+dV_T]$ when charge Q is placed on the cell.

A memory device can have distributions $P(Q,V_T)$ that are narrow compared with the working range of control voltages tolerated by the cells of the device. Accordingly, multiple non-overlapping distributions $P(Q_k,V_T)$ ("valleys") can be fit into the working range allowing for storage and reliable detection of multiple values of the charge $Q_k$, k= 1, 2, 3 . . . . The distributions (valleys) are interspersed with voltage intervals ("valley margins") where none (or very few) of the memory cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

One type of memory cell ("cell") is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use 2n levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of memory cells.

A memory device of a memory sub-system can have a logical address space including logical addresses. For example, in the case of NAND memory devices, the logical addresses can include logical block addresses (LBAs). The logical address space can be divided into a number of partitions. Each partition provides for a logical representation of a respective portion of the memory device. Each partition can be assigned a logical identifier, which is used by a host system to identify the partition when the memory sub-system is operatively coupled to the host system using a suitable interface standard. For example, each partition can a logical unit assigned a respective logical unit number (LUN).

Upon receiving a media access command from the host system designating a logical address (e.g., read command, write command, un-mapping command), a controller of the memory sub-system can translate the logical address into a corresponding physical address of the memory device to handle the media access command. For example, the logical identifier can be associated with a plane of the memory device, and each plane can include a number of physical translation units (PTUs). A PTU corresponds to a base granularity of data managed by the memory device. For example, each PTU can correspond to a physical address, which defines a physical location of the memory device with respect to a particular logical identifier and plane.

To translate the logical address, the controller can utilize a logical-to-physical (L2P) mapping data structure (e.g., L2P mapping table) that maintains a mapping of logical addresses to physical addresses. The controller can store the L2P mapping data structure using volatile memory (e.g., DRAM or SRAM). In some implementations, the L2P mapping table maintains a one-to-one mapping between logical addresses and respective physical addresses for "fine-grained L2P mapping" (e.g., a single logical address mapped to a single physical address). There can, however, be benefits to employing an L2P mapping data structure that supports coarser-grained L2P mappings, in which the L2P mapping data structure references multiple logical addresses with a single pointer, such as two LBAs, four LBAs, the size of a page of the memory device, etc.

Some memory sub-systems can implement one or more "data protection techniques" in an attempt to improve data reliability of data stored on a memory device (e.g., NAND). One such data protection technique is forced SLC caching. Forced SLC caching utilizes SLC cache to indirectly write data received from a host system to XLC storage, also referred to herein as an indirect XLC write mode. An XLC cell is a multiple level cell that stores more than one bit of state information per cell (e.g., MLC, TLC, QLC, PLC, as described above). Data written to the SLC cache can later be moved, asynchronously with respect to writing operations, from SLC cache to XLC storage to make room for future writes to the SLC cache (e.g., 1 bit in SLC cache can take up the same space as 4 bits in QLC storage). For example, the data can be moved in the background or during idle times to maintain performance. The SLC cache size can be selected in view of physical memory device constraints. For example, the SLC cache size can have a fixed size that does not exceed the available number of blocks on the memory device.

Data writes using the indirect XLC write mode can improve data reliability and safety as compared to a direct XLC write mode in which data is written to XLC storage directly without utilizing SLC caching. However, direct XLC write mode implementations can be more efficient than having to first program data to SLC cache before migration to XLC storage. Therefore, it may be inefficient to perform forced SLC caching to write non-critical data indirectly to XLC storage, as compared to writing non-critical data directly to XLC storage. Non-critical data can include data of which reliability is not of high importance and/or data that may not require immediate recovery. Examples of non-critical data include audio files, user applications that can be rebuilt or re-downloaded, non-critical log files, etc.

Some types of memory sub-systems, such as Universal Flash Storage (UFS) memory sub-systems, can have broad temperature ranges and high reliability requirements (including power loss protection). One type of memory sub-system is an automotive UFS memory sub-system. In such memory sub-systems, the one or more data protection techniques can be implemented as a default setting, such that all data is treated as requiring full data protection using the one or more data protection techniques. Accordingly, such memory sub-systems can operate inefficiently when it comes to storing data in which reliability is not sufficiently important (e.g., non-critical data).

Aspects of the present disclosure address the above and other deficiencies by providing a memory sub-system that implements power safety configurations for partitions. For example, a host system can be operatively coupled to the memory sub-system. Embodiments described herein provide for a mechanism that can enable a memory sub-system to receive, from the host system, host-configured power safety information that can be used to determine, for a partition, whether to implement a power safety technique for writing and storing data (e.g., indirect XLC writes to XLC storage via forced SLC caching). The power safety technique can be implemented as part of a set of data protection techniques. If the host-configured power safety information indicates that the partition does not need to implement power safety, then the memory sub-system can utilize a less costly technique for writing and storing data (e.g., direct XLC writes to XLC storage). In some implementations, the memory sub-system can operate in an indirect XLC write mode as a default setting. The mechanism can be implemented as an extension of an interface specification (e.g., UFS).

For example, the memory sub-system can receive, from the host system, a request for power safety capability information for a number of partitions. The memory sub-system can provide the power safety capability information in response to receiving the request for power safety capability information. The host system can generate, from the power safety capability information, a partition data structure (e.g., table). The partition data structure can maintain a power safety configuration for each partition. For each partition in the partition data structure, the memory sub-system can receive a respective power safety configuration from the host system. For each power safety configuration, the memory sub-system can send an acknowledgment back to the host system acknowledging receipt of the power safety configuration.

Each power safety configuration can indicate, for the respective partition, whether the partition requires power safe writing. That is, the power safety configuration informs the memory sub-system about the importance of data reliability for the data written to that partition, which tells the memory sub-system how data should be written to the partition. A power safety configuration for a partition indicating that data reliability is not sufficiently important for data written to the partition means that power safe writing to the partition need not be enabled. For example, the memory sub-system can operate in a direct XLC write mode to write the data for the partition (i.e., direct write to XLC storage). In contrast, a power safety configuration indicating that data reliability is sufficiently important for data written to the partition means that power safe writing to the partition should be enabled. For example, the memory sub-system can operate in an indirect XLC write mode to write data for the partition (i.e., indirect writing to XLC storage using forced SLC caching). Further details regarding implementing power safety configurations for partitions are described below with reference to FIGS. 1-5.

Advantages of the present disclosure include, but are not limited to, reduced overhead and improved performance in the memory sub-system. For example, by identifying data that can be written using direct XLC writes instead of indirect XLC writes via forced SLC caching, embodiments described herein can achieve improved performance, power efficiency and endurance. Moreover, embodiments described herein can allow for more efficient power loss, power on and power down without requiring storing and/or restoring of partition states. Accordingly, embodiments described herein can achieve improved user experience, faster boot times, and faster power transitions.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a power safety component 113. In some embodiments, the memory sub-system controller 115 includes at least a portion of the power safety component 113. In some embodiments, the power safety component 113 is part of the host system 110, an application, or an operating system. In other embodiments, local media controller 135 includes at least a portion of power safety component 113 and is configured to perform the functionality described herein. The power safety component 113, in conjunction with the host system 120, is configured to implement power safety configurations for partitions of a logical address (e.g., LBA) space. Further details regarding implementing power safety configurations for partitions will now be described below with reference to FIG. 2.

Figure 2:
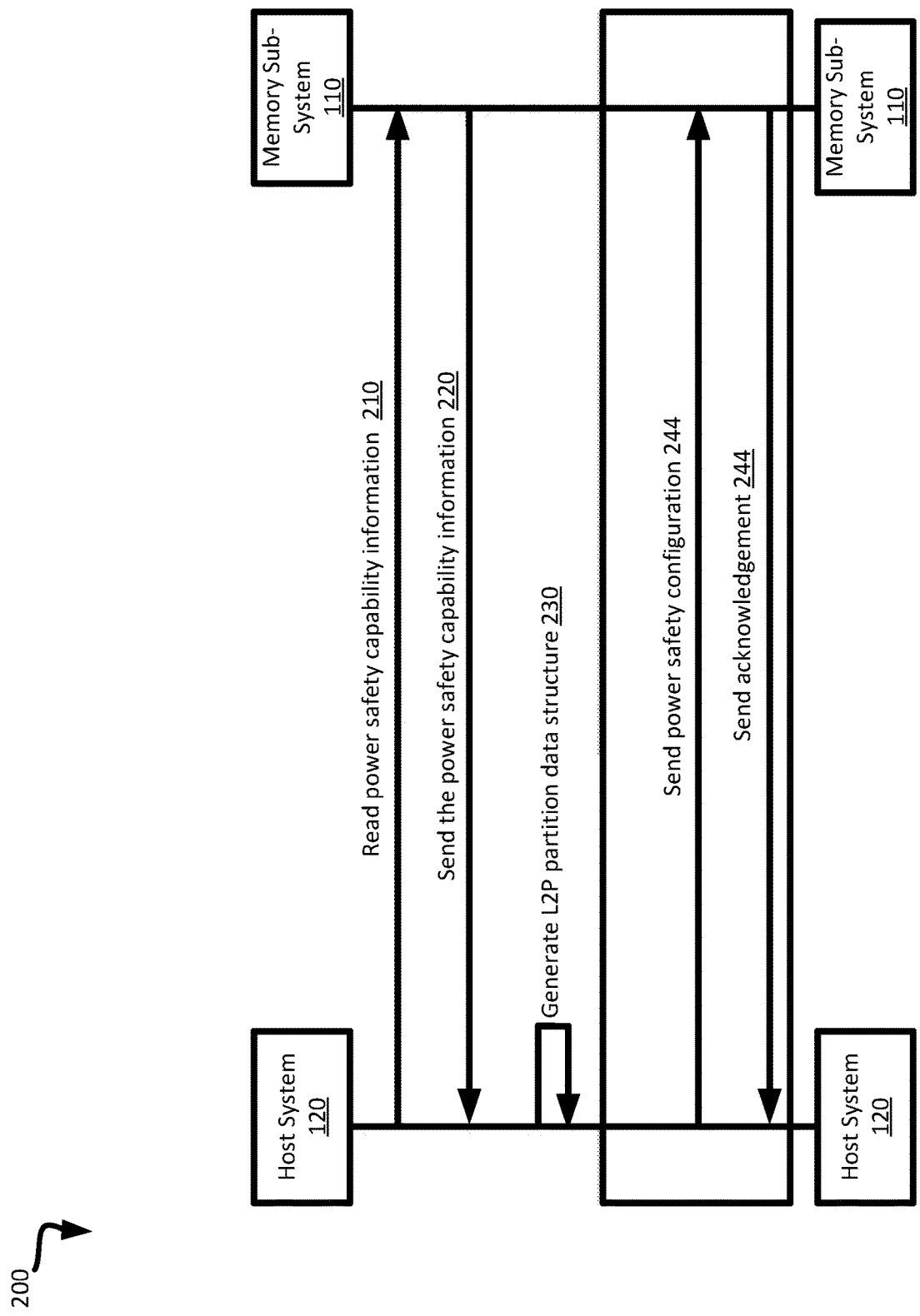
FIG. 2 is a timing diagram of an example interaction between a host system and a memory sub-system for implementing power safety configurations for logical address space partitions, in accordance with some embodiments of the present disclosure.

FIG. 2 is a timing diagram 200 an example interaction between the host system 120 and the memory sub-system 110 (e.g., power safety component 113) for implementing power safety configurations for logical address space partitions, in accordance with some embodiments of the present disclosure. As shown, at step 210, the memory sub-system 110 can receive, from the host system 120, a request to read power safety capability information for a logical address space of a memory device of the memory sub-system 110 (e.g., memory device 130). At step 220, the memory sub-system 110 can send the power safety capability information to the host system 120. The logical address space can include a number of logical addresses. In some embodiments, the logical addresses include logical block addresses ("LBAs"). The logical address space can be divided into a number of partitions. Each partition can be associated with a respective identifier (e.g., LUN).

In some embodiments, the power safety capability information can include device descriptor data and partition descriptor data. For example, if the memory sub-system 110 is a UFS drive, then the device descriptor data can be UFS device descriptor data. The device descriptor data can include a device descriptor field by which the memory sub-system 110 can advertise, to the host device 120, support for configurable power safety for the partitions. In some embodiments, the device descriptor data includes a single power safety configuration bit. For example, a bit value of "0" can indicate that the memory sub-system 110 does not support power safety designations for partitions, while a bit value of "1" can indicate that the memory sub-system 110 supports power safety designations for partitions.

The partition descriptor data can include a partition descriptor field used to configure a specific partition as being designated for power safety (i.e., whether the partition requires power safe writing). Each partition is associated with a respective partition descriptor. In some embodiments, the partition descriptor data includes a power safety designation byte. For example, a byte value of "0" can indicate that the partition does not require power safe writing, while a byte value of "1" can indicate that power safe writing should be utilized for the partition.

Upon receiving the device descriptor data, the host system 120 can determine whether the memory sub-system 110 supports configurable power safety (e.g., by checking the device descriptor field). If so, the host system 120 can then, for a partition to be configured, issue a second request (e.g., command) to the memory sub-system 110 with partition descriptor data for the LUN to be configured. The second request can include an appropriate power safety designation (e.g., power safety designation byte) for the partition to be configured. In response to receiving and executing the second request, the memory sub-system 110 can provide, to the host system 120, a second response indicating a successful status. The process can be repeated for any suitable number of partitions to be configured.

In response to receiving the power safety capability information, the host system 120 can generate a partition data structure (e.g., table) at step 230. The partition data structure can maintain power safety configurations for respective ones of the partitions. Each power safety configuration can indicate, for the respective partition, whether data reliability is sufficiently important for the partition, and thus whether power safe writing should be used to write data to the partition. For example, a power safety configuration indicating that a partition does not require power safe writing can cause the memory sub-system 110 to operate in a direct XLC write mode to write the data for the partition (i.e., direct write to XLC storage). As another example, a power safety configuration indicating that power safe writing should be used to write data for the partition can cause the memory sub-system 110 to operate in an indirect XLC write mode to write data for the L2P partition (i.e., indirect writing to XLC storage using forced SLC caching). An illustrative example of a partition data structure maintaining power safety configurations will be described below with reference to FIG. 3.

After generating the partition data structure, a partition loop 240 can be initiated. During the partition loop 240, the memory sub-system controller 110 can, at step 242, receive a power safety configuration for a partition specified within the partition data structure from the host system 120. At step 244, the memory sub-system controller 110 can send an acknowledgment of receipt of the power safety configuration for the partition to the host system 120. The partition loop 240 can continue until a power safety configuration is sent for each partition specified within the partition data structure.

After the partition loop is completed, the host system 120 can send a request (e.g., command) to the memory sub-system 110 to finalize a set of power safety configurations, and the memory sub-system 110 can finalize the set of power safety configurations. For example, the request can include a request to write to a configuration descriptor setting. In response to receiving and executing the request, the memory sub-system 110 can send an acknowledgment that the finalizing is complete to the host system 120. Accordingly, the host system 120 can, in conjunction with the memory sub-system 110, configure a power safety setting for each partition.

In some embodiments, power safety is a default setting for all data. Thus, if the host system 120 configures all partitions with power safety configurations indicating that a power safety technique should be implemented for performing a media access operation with respect to the partitions, then the memory sub-system 110 would perform the media access operation in accordance with the default setting. However, if the host system 120 configures at least one partition as not requiring a power safety technique to be implemented for performing the media access operation with respect to the at least one partition (i.e., at least one non-power-safe partition), then the memory sub-system 110 can perform the media access operation with respect to the at least one non-power-safe partition without using the power safety technique.

In some embodiments, the media access operation is a write operation, and the set of power safety configurations can be used to simplify data caching performed by the memory sub-system 110. For example, if the memory sub-system 110 is a UFS memory sub-system, the memory sub-system 110 can use a write cache in which the host system 120 writes data to the memory sub-system, and the memory sub-system 110 completes the command successfully by writing data to the write cache and not the memory device. For a power safe partition in which the host system 120 wants to guarantee data is written to the memory device, the host system 120 can send a cache synchronization command to the memory sub-system 110. In response to receiving the cache synchronization command, the memory sub-system 110 can flush all data for the power safe partitions in the write cache to the memory device and return a status indication to the host system 120 when this is complete. The cache synchronization mechanism allows the memory sub-system 110 to use a write cache and still have the host system 120 be able to control when needed that data has made it successfully to media.

However, for each non-power-safe partition, the memory sub-system 110 can ignore the cache synchronization command with respect to data for the non-power-safe partition in the write cache (i.e., only flush data from the write cache for the power safe partitions). The memory sub-system 110 can eventually flush the data for the non-power-safe partition from the write cache to the memory device during a less active time (e.g., idle time of the device, or when entering a lower power mode like a sleep mode). This can improve user performance, as more user activity is pushed from synchronous to the user to asynchronous.

In some embodiments, the media access operation is a data recovery operation, and the set of power safety configurations can be used to simplify a power recovery policy. For example, if the memory sub-system 110 is a UFS sub-system, the memory sub-system 110 can expect that data written to power safe partitions can be recovered when powering up after an unexpected power loss. The assumption is that there is no power hold-up, so writes in flight can be lost partially or completely (in contrast to other memory sub-systems like SSDs that guarantee write completion). All data written for power safe partitions before the cache synchronization (described above) is expected to be recovered on power-up. The memory sub-system 110 can recover such data by performing a variety of data recovery techniques, such as extended error correction, data analysis, etc., which can consume time and/or resources (e.g., energy). For non-power-safe partitions in which data recovery is not important, these data recovery techniques can be skipped, leading to a faster boot time.

Figure 3:
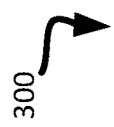
FIG. 3 is a diagram of an example organization of an example logical address space partition data structure, in accordance with some embodiments of the present disclosure.

FIG. 3 is a diagram of an example logical address space partition data structure ("partition data structure") 300, in accordance with some embodiments of the present disclosure. In some embodiments, and in this illustrative example, the partition data structure 300 is a partition table.

As shown, the data structure 300 includes a number of columns 310-350. Column 310 is named "Partition Name" and includes the names of respective partitions, column 320 is named "Starting Address" and includes the starting addresses (e.g., LBAs) of the respective partitions, column 330 is named "Length" and includes the lengths of the respective partitions, column 340 is named "Purpose" and includes descriptions of the purpose of the respective partitions, and column 350 is named "Power safety" and indicates, for each partition, whether power safety is enabled for the partition (i.e., whether the partition is a power safe partition or a non-power-safe partition). It is assumed in this illustrative example that the total number of addresses (e.g., LBAs) is 62,500,000 and the total capacity of the memory device is 256 GB.

For example, the first row of the data structure 300 corresponds to a "boot" partition having a purpose of storing a boot loader. The data structure 300 indicates that the boot partition has a starting address of 0, a length of 16,384 and that power safety is enabled. Thus, the boot partition is designated as a power safe partition. The boot partition is a power safe partition because the boot partition can be needed for boot.

The second row of the data structure 300 corresponds to a "system" partition having a purpose of storing system and service files. The data structure 300 indicates that the system partition has a starting address of 16,384 (i.e., the ending address of the boot partition), a length of 5,242,880 and that power safety is enabled. Thus, the system partition is designated as a power safe partition. The system partition is designated as a power safety partition because the system partition can be needed for proper system and service performance.

The third row of the data structure 300 corresponds to a "cache" partition having a purpose defining a temporary memory extension. For example, the cache partition can serve as a temporary virtual memory and/or DRAM extension. The data structure 300 indicates that the cache partition has a starting address of 5,259,264 (i.e., the ending address of the system partition), a length of 16,777,216 and that power safety is disabled. Thus, the cache partition is designated as a non-power-safe partition. The cache partition is designated as a non-power safe partition because the cache partition is not needed across power cycles.

The fourth row of the data structure 300 corresponds to an "app" partition having a purpose defining user application binaries. The data structure 300 indicates that the app partition has a starting address of 6,307,840 (i.e., the ending address of the cache partition), a length of 16,777,216 and that power safety is disabled. Thus, the app partition is designated as non-power-safe partition. The app partition is designated as a non-power-safe partition because the app partition data can be re-downloaded by a user from an application repository (e.g., remote application storage)

The fifth row of the data structure 300 corresponds to an application data ("appdata") partition having a purpose defining user application data. The data structure 300 indicates that the appdata partition has a starting address of 23,085,056 (i.e., the ending address of the app partition), a length of 16,777,216 and that power safety is enabled. Thus, the appdata partition is designated as a power-safe partition. The appdata partition is designated as a power safe partition because users may not like having their data corrupted.

The sixth row of the data structure 300 corresponds to a "media" partition having a purpose defining user media files (e.g., audio files, visual files, audiovisual files). The data structure 300 indicates that the media partition has a starting address of 39,862,272 (i.e., the ending address of the appdata partition), a length of 22,637,728 and that power safety is disabled. Thus, the media partition is designated as non-power-safe partition. The media partition is designated as a non-power-safe partition because users can re-download media files from a media file repository (e.g., remote media file storage).

Figure 4:
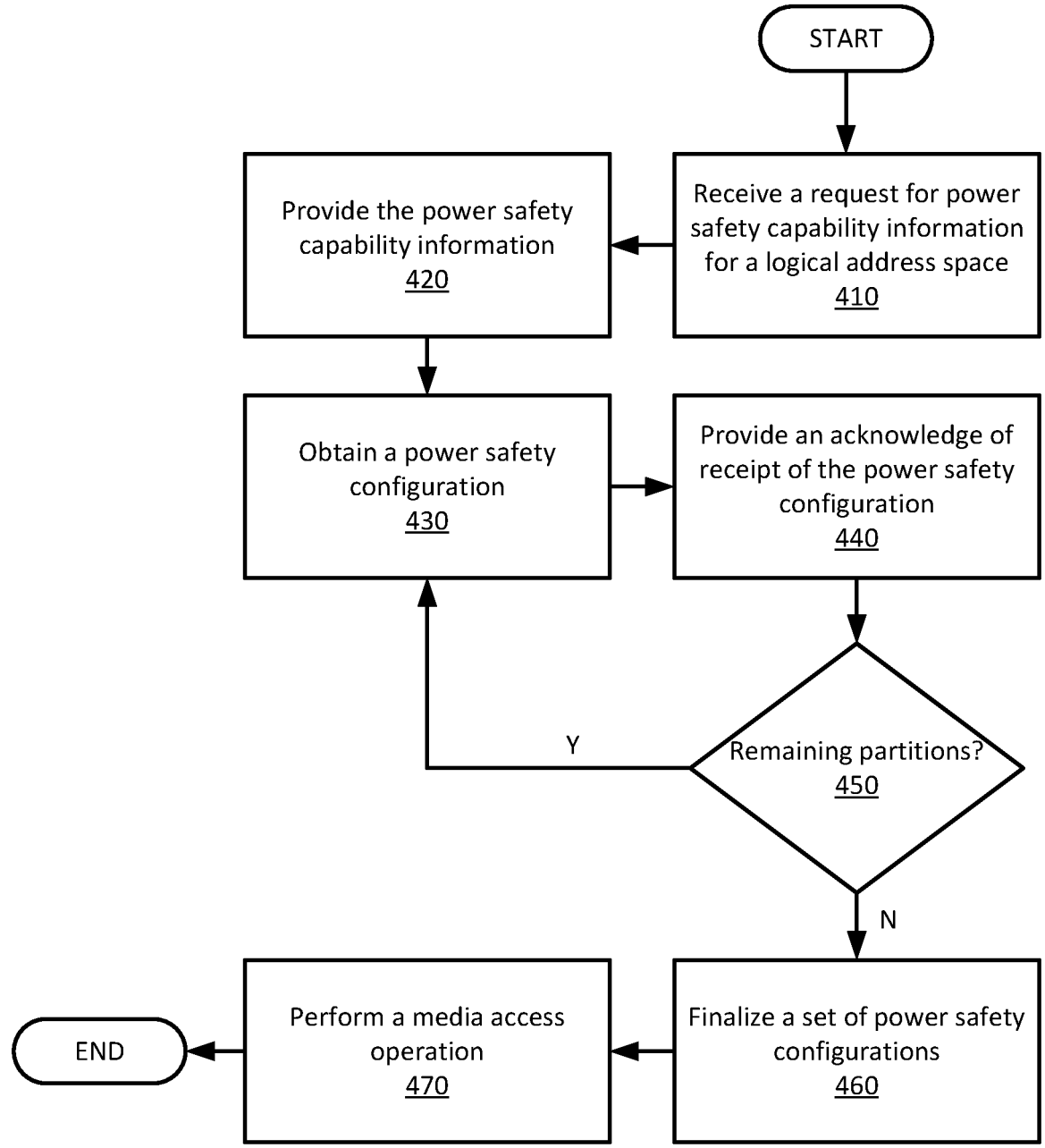
FIG. 4 is a flow diagram of an example method for implementing power safety configurations for logical address space partitions, in accordance with some embodiments of the present disclosure.

FIG. 4 is a flow diagram of an example method for implementing power safety configurations for logical address space partitions, in accordance with some embodiments of the present disclosure. The method 400 can be performed by control logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the power safety component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, a request for power safety capability information for a logical address space is received and, at operation 420, the power safety capability information is provided. For example, control logic can receive the request for power safety capability information from a host system, and can provide the power safety capability information to the host system in response to receiving the request.

For example, the logical address space can include a number of logical addresses of a memory device of a memory sub-system operatively coupled to the host system. In some embodiments, the logical addresses include logical block addresses ("LBAs"). The logical address space can be divided into a set of partitions. Each partition can be associated with a respective identifier. For example, each partition can be a logical unit associated with a respective logical unit number (LUN).

At operation 430, a power safety configuration for a partition is received and, at operation 440, an acknowledgment of receipt of the power safety configuration is provided. For example, control logic can obtain the power safety configuration for the partition from the host system, and can provide the acknowledgment to the host system.

At operation 450, it is determined whether there are any remaining partitions. For example, control logic can determine whether there includes at least one partition for which a power safety configuration has not been received. If so, the process can revert back to operation 430 to obtain another power safety configuration for a remaining partition.

Otherwise, if there are no remaining partitions, this means that there are no more power safety configurations left to receive from the host system. At operation 460, a set of power safety configurations is finalized. For example, control logic can finalize the set of power safety configurations in response to receiving a request (e.g., command) from the host system to finalize the partition configuration, and can provide the host system an acknowledgement upon completing the finalizing. For example, the request can include a request to write to a configuration descriptor setting.

At operation 470, a media access operation can be performed. For example, control logic can cause the media access operation to be performed using the set of power safety configurations. Performing the media access operation can include looking up the power safety configuration for the requested partition from its internal copy of the partition data structure, and using that information to perform the media access operation. In some embodiments, the media access operation is a write operation.

In some embodiments, power safety is a default setting for all data. Thus, if the host system configures all partitions with power safety configurations indicating that a power safety technique should be implemented for performing a media access operation with respect to the partitions, then control logic can cause the media access operation in accordance with the default setting. However, if the host system configures at least one partition as not requiring a power safety technique to be implemented for performing the media access operation with respect to the at least one partition (i.e., at least one non-power-safe partition), then control logic can cause the media access operation to performed with respect to the at least one non-power-safe partition without using the power safety technique.

In some embodiments, the media access operation is a write operation, and the set of power safety configurations can be used to simplify data caching performed during a write operation. For example, in the case of a UFS memory sub-system (or other similar memory sub-system), data received from the host system can be written to a write cache of the UFS memory sub-system, and the USF memory sub-system completes the command successfully by writing data to the write cache and not a memory device. For a power safe partition in which the host system wants to guarantee data is written to the memory device, the host system can send a cache synchronization command to the UFS memory sub-system. In response to receiving the cache synchronization command, the UFS memory sub-system can flush all data for the power safe partitions in the write cache to the memory device and return a status indication to the host system when this is complete. The cache synchronization mechanism allows the UFS memory sub-system to use a write cache and still have the host system be able to control when needed that data has made it successfully to media.

However, for each non-power-safe partition, the UFS memory sub-system can ignore the cache synchronization command with respect to data for the non-power-safe partition in the write cache (i.e., only flush data from the write cache for the power safe partitions). The UFS memory sub-system can eventually flush the data for the non-power-safe partition from the write cache to the memory device during a less active time (e.g., idle time of the device, or when entering a lower power mode like a sleep mode). This can improve user performance, as more user activity is pushed from synchronous to the user to asynchronous.

In some embodiments, the media access operation is a data recovery operation, and the set of power safety configurations can be used to simplify a power recovery policy. For example, in the case of a UFS memory sub-system (or other similar memory sub-system), the UFS memory sub-system can expect that data written to power safe partitions can be recovered when powering up after an unexpected power loss. The assumption is that there is no power hold-up, so writes in flight can be lost partially or completely (in contrast to other memory sub-systems like SSDs that guarantee write completion). All data written for power safe partitions before the cache synchronization (described above) is expected to be recovered on power-up. The UFS memory sub-system can recover such data by performing a variety of data recovery techniques, such as extended error correction, data analysis, etc., which can consume time and/or resources (e.g., energy). For each non-power-safe partition in which data recovery is not important, these data recovery techniques can be skipped, leading to a faster boot time. Further details regarding operations 410-470 are described above with reference to FIGS. 1-3.

Figure 5:
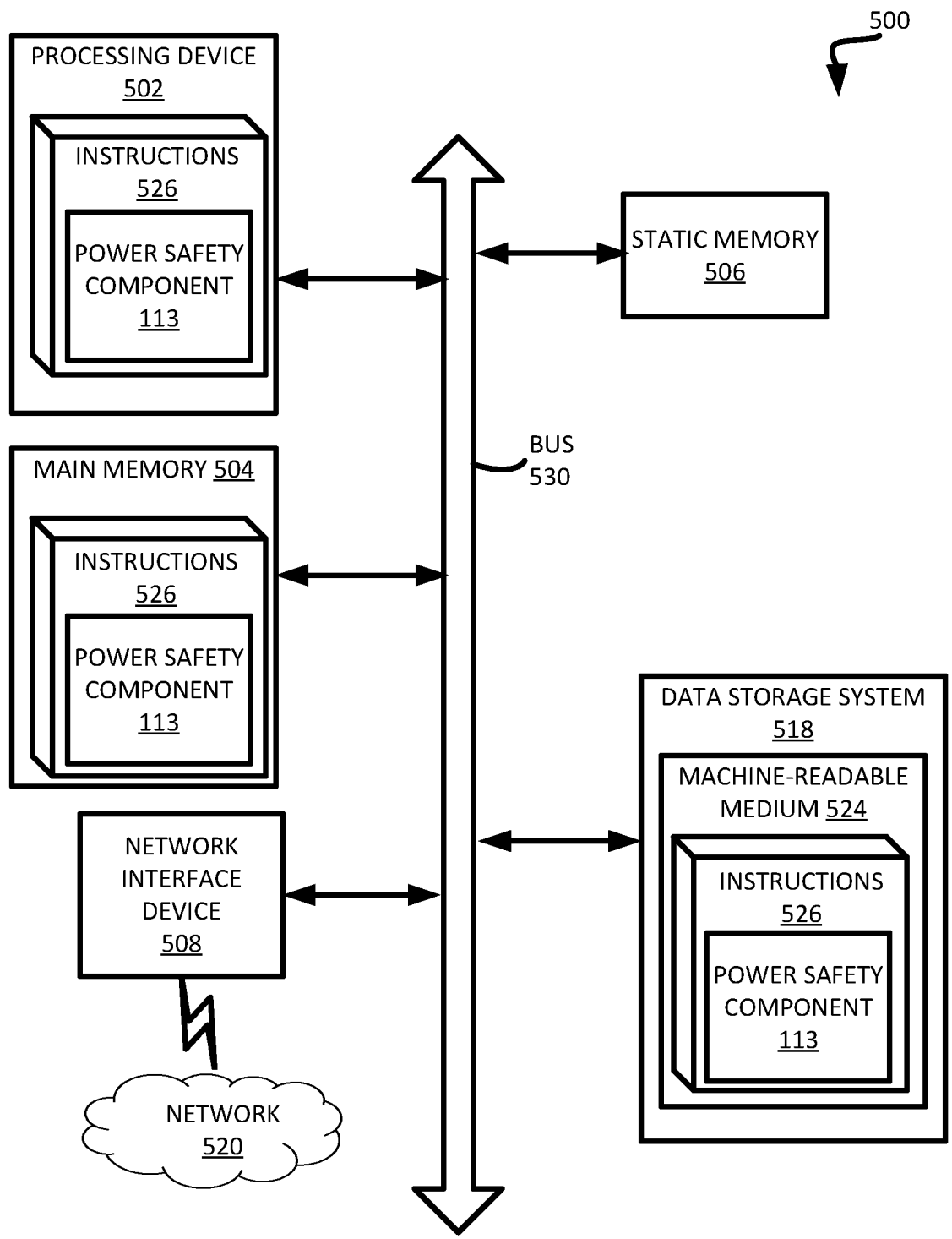
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the power safety component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to an power safety component (e.g., the power safety component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device associated with a logical address space; and
a processing device, operatively coupled with the memory device, to perform operations comprising:
providing, to a host system, power safety capability information for the logical address space, wherein the power safety capability information comprises partition descriptor data associated with a partition of a set of partitions of the logical address space;
obtaining, from the host system, a power safety configuration for the partition determined by the host system in accordance with the power safety capability information, wherein the power safety configuration for the partition configures the memory device to implement power safe writing for the partition by operating in a write mode utilizing single level cell (SLC) caching, or to implement non-power safe writing for the partition by operating in a second write mode without utilizing SLC caching; and
providing, to the host system, an acknowledgement of receipt of the power safety configuration.

2. The system of claim 1, wherein the power safety configuration for the partition is located within a partition data structure, and wherein the partition data structure maintains, for each partition of the set of partitions, a starting address of the partition, an address length of the partition, and a configured power safety of the partition.

3. The system of claim 1, wherein the set of partitions comprises at least one of: a boot partition, a system partition, a cache partition, an application partition, an application data partition, or a media partition.

4. The system of claim 1, wherein the power safety capability information further comprises device descriptor data.

5. The system of claim 4, wherein the device descriptor data comprises a field indicative of whether the memory device supports power safety designations for partitions.

6. The system of claim 1, wherein the partition descriptor data comprises a field indicative of whether to implement power safe writing for the partition.

7. The system of claim 1, wherein the operations further comprise:
finalizing a set of power safety configurations; and
causing a media access operation to be performed using the set of power safety configurations.

8. A method comprising:
providing, by a processing device to a host system, power safety capability information for a logical address space associated with a memory device, wherein the power safety capability information comprises partition descriptor data associated with a partition of a set of partitions of the logical address space;
obtaining, by the processing device from the host system, a power safety configuration for the partition determined by the host system in accordance with the power safety capability information, wherein the power safety configuration for the partition configures the memory device to enable power safe writing for the partition by operating in a write mode utilizing single level cell (SLC) caching, or to enable non-power safe writing for the partition by operating in a second write mode without utilizing SLC caching; and
providing, by the processing device to the host system, an acknowledgement of receipt of the power safety configuration.

9. The method of claim 8, wherein the power safety configuration for the partition is located within a partition data structure, and wherein the partition data structure maintains, for each partition of the set of partitions, a starting address of the partition, an address length of the partition, and a configured power safety of the partition.

10. The method of claim 8, wherein the set of partitions comprises at least one of: a boot partition, a system partition, a cache partition, an application partition, an application data partition, or a media partition.

11. The method of claim 8, wherein the power safety capability information further comprises device descriptor data.

12. The method of claim 11, wherein the device descriptor data comprises a field indicative of whether the memory device supports power safety designations for partitions.

13. The method of claim 8, wherein the partition descriptor data comprises a field indicative of whether to implement power safe writing for the partition.

14. The method of claim 8, further comprising:
finalizing, by the processing device, a set of power safety configurations; and
causing, by the processing device, a media access operation to be performed using the set of power safety configurations.

15. A system comprising:
a memory device associated with a logical address space; and
a processing device, operatively coupled with the memory device, to perform operations comprising:
receiving, from a host system, a request for power safety capability information for the logical address space;
providing, to the host system, the power safety capability information, wherein the power safety capability information comprises device descriptor data associated with the memory device and partition descriptor data associated with a partition of a set of partitions of the logical address space;
obtaining, from the host system, a power safety configuration for the partition determined by the host system in accordance with the power safety capability information, wherein the power safety configuration for the partition configures the memory device to implement power safe writing for the partition by operating in a write mode utilizing single level cell (SLC) caching, or to implement non-power safe writing for the partition by operating in a second write mode without utilizing SLC caching; and
providing, to the host system, an acknowledgement of receipt of the power safety configuration.

16. The system of claim 15, wherein the power safety configuration for the partition is located within a partition data structure, and wherein the partition data structure maintains, for each partition of the set of partitions, a starting address of the partition, an address length of the partition, and a configured power safety of the partition.

17. The system of claim 15, wherein the set of partitions comprises at least one of: a boot partition, a system partition, a cache partition, an application partition, an application data partition, or a media partition.

18. The system of claim 15, wherein the device descriptor data comprises a field indicative of whether the memory device supports power safety designations for partitions.

19. The system of claim 15, wherein the partition descriptor data comprises a field indicative of whether to implement power safe writing for the partition.

20. The system of claim 15, wherein the operations further comprise:
   finalizing a set of power safety configurations; and
   causing a media access operation to be performed using the set of power safety configurations.

* * * * *